United States Patent [19]

Wallgren et al.

[11] Patent Number: 4,659,002

[45] Date of Patent: Apr. 21, 1987

[54] APPARATUS FOR REPLACEMENT OF THROUGH-HOLE MOUNTED PCB COMPONENTS

[75] Inventors: Linus E. Wallgren, Rockville; Robert Fridman, Randallstown; William J. Siegel, Silver Spring, all of Md.

[73] Assignee: Pace, Incorporated, Laurel, Md.

[21] Appl. No.: 763,704

[22] Filed: Aug. 8, 1985

[51] Int. Cl.⁴ .................. B23K 1/08; B23K 37/06
[52] U.S. Cl. .................................. 228/8; 228/36; 228/39; 228/56.1; 228/56.5; 228/264; 118/429; 164/312; 222/594
[58] Field of Search ............. 228/264, 119, 19, 37, 228/36, 39, 33, 8, 56.1, 56.5; 118/429; 164/312; 222/594, 597

[56] References Cited

U.S. PATENT DOCUMENTS

| | | | |
|---|---|---|---|
| 2,964,007 | 12/1960 | Buffington | 228/39 |
| 3,361,869 | 1/1968 | Gutbier et al. | 228/33 |
| 3,511,304 | 5/1970 | Baier et al. | 164/437 |
| 3,613,768 | 10/1971 | Awano et al. | 164/312 |
| 3,684,151 | 8/1972 | Burman et al. | 228/19 |
| 3,901,306 | 8/1975 | Miki et al. | 164/312 |
| 4,412,641 | 11/1983 | Fuchs et al. | 228/37 |
| 4,426,571 | 1/1984 | Beck | 228/264 |
| 4,506,820 | 3/1985 | Brucker | 228/39 |
| 4,527,731 | 7/1985 | Kent et al. | 228/37 |

FOREIGN PATENT DOCUMENTS

| | | | |
|---|---|---|---|
| 145900 | 6/1985 | European Pat. Off. | 228/33 |
| 193760 | 11/1984 | Japan | 228/8 |
| 76272 | 4/1985 | Japan | 228/33 |
| 1297138 | 11/1972 | United Kingdom | 228/56.1 |

*Primary Examiner*—Nicholas P. Godici
*Assistant Examiner*—Samuel M. Heinrich
*Attorney, Agent, or Firm*—Gerald J. Ferguson, Jr.; Michael P. Hoffman; Ronni S. Malamud

[57] ABSTRACT

An apparatus is disclosed for removing or installing at least one through-hole mounted component from a printed circuit board or the like, the apparatus including a compliant mask for contacting and supporting the printed circuit board with the mask having at least one hole extending therethrough and the hole being aligned with the component. A conduit is provided for directing liquid solder into the hole in the mask to contact leads of the component and thus facilitate installation or removal thereof from the board.

17 Claims, 9 Drawing Figures

4,659,002

APPARATUS FOR REPLACEMENT OF THROUGH-HOLE MOUNTED PCB COMPONENTS

BACKGROUND OF THE INVENTION

1. Field of the Invention

This invention relates to apparatus for replacing or installing components mounted on printed circuit boards (PCB's) and the like and, in particular, to apparatus for replacing or installing components mounted on such boards utilizing through-hole mountings.

Surface mounted devices (SMD's) have come into use in the last ten years or so, such devices being mounted on the same side of a printed circuit board the printed circuit is present. However, 85 to 95 percent of the electronic devices currently used in PCB assemblies utilize through-hole mounting—that is, the device is mounted on one side of the board and the leads therefor extend through plated-through holes or the like extending through the board to termination pads for the printed circuit on the opposite of the board. Apparatus for removing such devices are known such as those disclosed in U.S. Pat. Nos. 3,557,430 and 4,412,641. These devices have various shortcomings in terms of cost, maintenance, and/or use which are resolved by the component replacement device of the present invention. Other prior art of interest is U.S. Pat. Nos. 3,684,151; 3,731,866; 4,022,370; and 4,162,034.

2. Summary of the Invention

Accordingly, it is a primary object of the present invention to provide an improved component removing apparatus where the components are through-hole mounted on a PCB.

It is a further object of this invention to provide a device of the above type wherein a compliant mask or blanket is utilized to support the PCB and/or to provide molten solder to selected portions of the PCB to effect installation or replacement of components or devices on the board.

It is a further object of this invention to provide a compliant mask for use in a device of the above type where holes in the mask may either be pre-cut to conform to the size of standardized electronic devices or may be cut by the operator at the time the component or components are to be removed and/or installed.

It is a further object of the invention to provide an improved apparatus of the above type wherein molten solder or the like is used to remove or install the components.

It is a further object of this invention to provide an improved apparatus of the above type wherein a component to be installed or removed may be readily positioned with respect to the area where molten solder is applied to the board.

It is a further object of this invention to provide an improved apparatus of the above type where the level of the molten solder with respect to the PCB may be subject to both coarse and fine adjustment.

It is a further object of this invention to provide in an apparatus of the above type means for detecting when the molten solder has reached a predetermined level with respect to the PCB.

It is a further object of this invention to provide in a device of the above type means for positively holding the PCB in place while a component is being either removed or installed with respect thereto.

It is a further object of this invention to provide means for removing dross from the molten solder in a open-loop type of soldering apparatus.

In general, the objects of this invention further include provision of improved apparatus for (1) rapid, simultaneous lead soldering or desoldering, (2) component isolation, (3) PCB stress prevention, (4) controlled temperature, and (5) through-hole cleaning capability.

Other objects and advantages of this invention will be apparent from a reading of the following specification and claims taken with the drawings.

DETAILED DESCRIPTION OF THE PREFERRED EMBODIMENTS OF THE INVENTION

Figure 1:
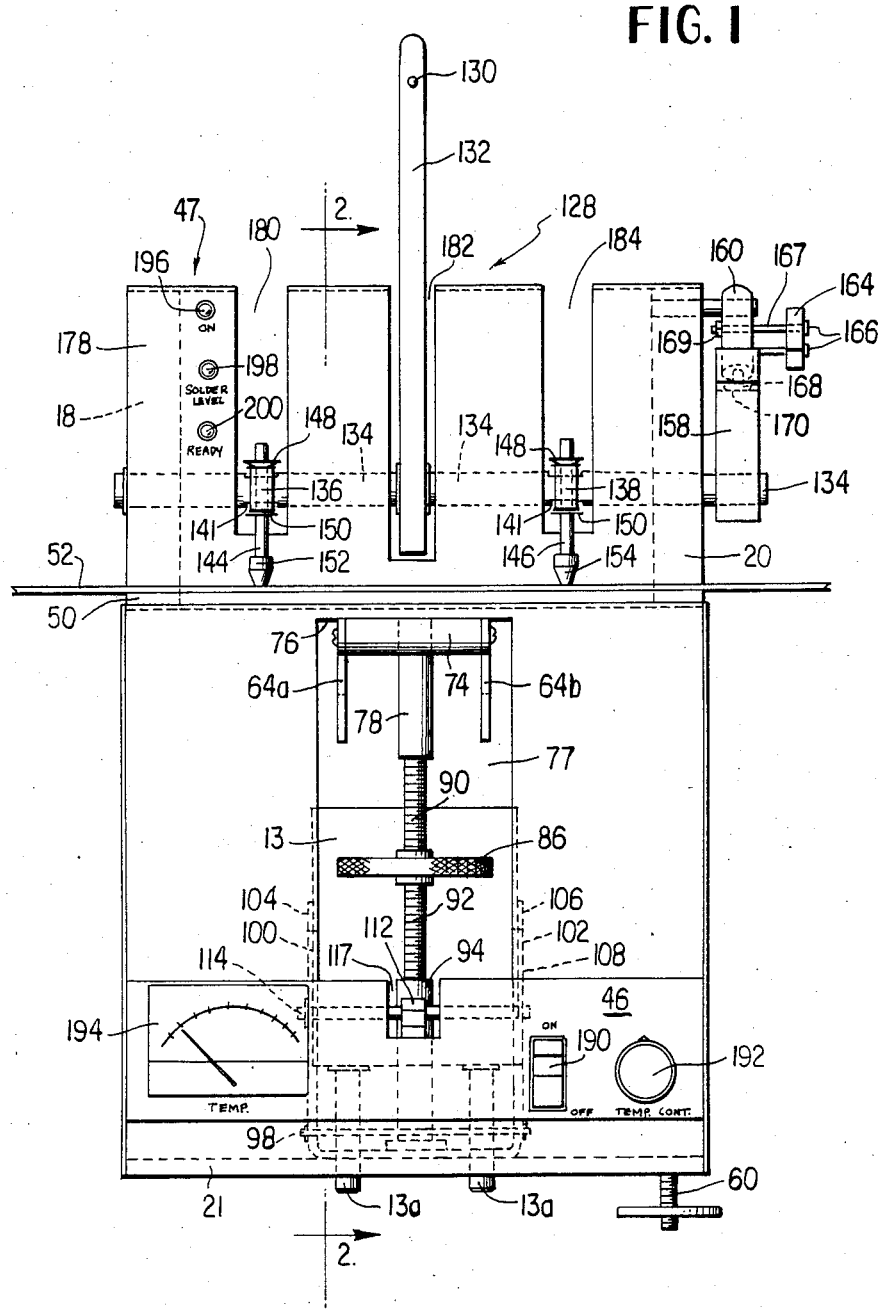
FIG. 1 is a front view of a desoldering apparatus in accordance with the invention.

Reference should be made to the drawing where like reference numerals refer to like parts.

Figure 2:
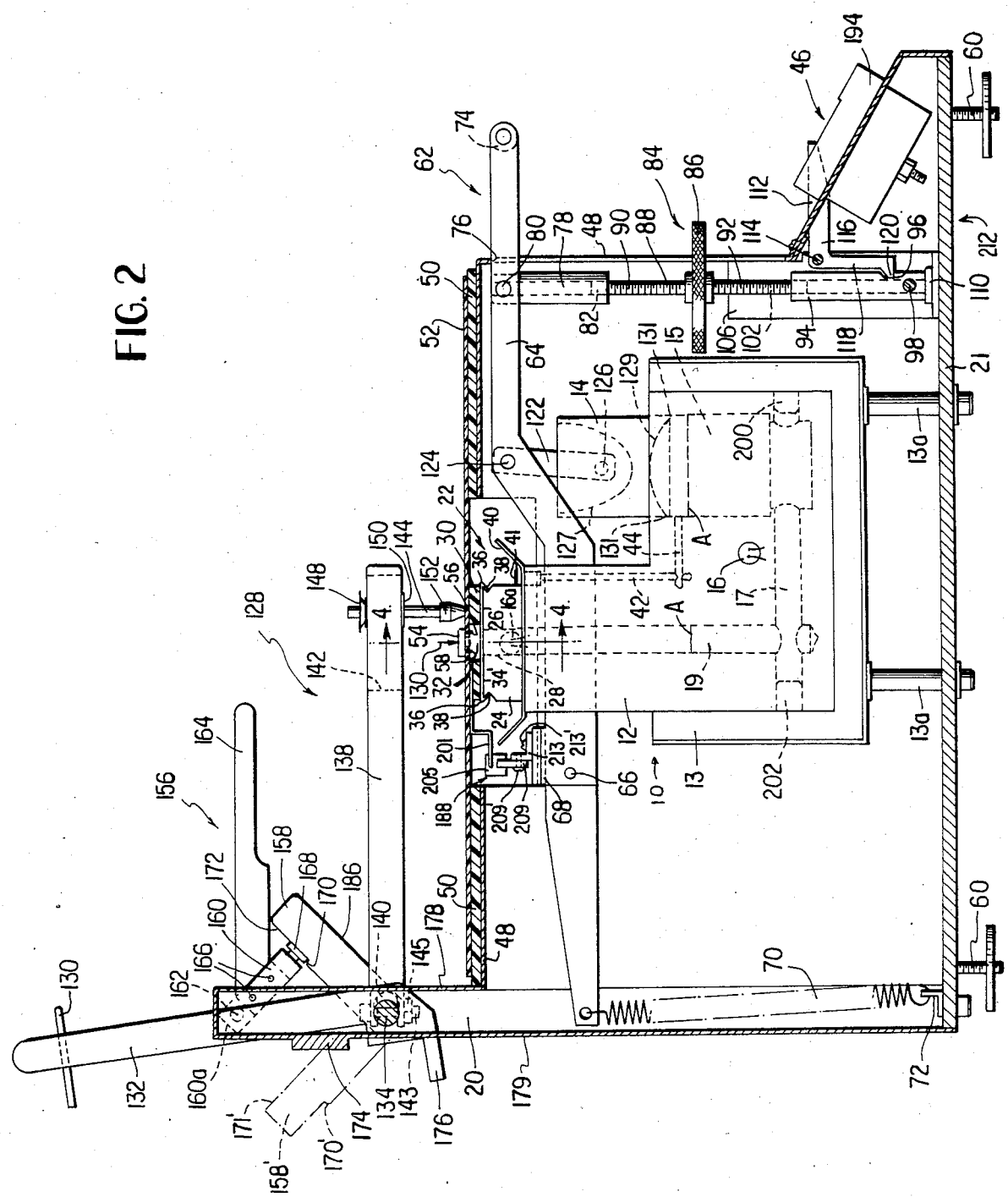
FIG. 2 is a cross-sectional view along the line 2—2 of FIG. 1.

Referring to FIGS. 1 and 2, there is generally illustrated an apparatus in accordance with the invention which constitutes the following general components. A heater assembly 10 includes a block 12 made of iron or a like material and mounted in a casing 13 of insulating material, the casing being mounted on posts 13a. A piston 14 and a cartridge heater 16 are also included in the heater assembly. Block 12 has a large opening or cylinder 15 in which piston 14 reciprocates and two narrow passageways 17 and 19 through which the solder is transferred. Due to the substantially larger diameter of cylinder 15 with respect to that of passageways 17 and 19, a relatively small movement of the solder in cylinder 15 translates into a much larger movement in the smaller passageways. Mounted on heater assembly 10 is a bed unit indicated at 22 which includes a block 24 having an upper surface 26, the block preferably being made of a material such as steel. An opening 28 extends through block 24 and communicates with passageway 19 in iron block 12. One or more heater catridges 16a may be incorporated in block 24 depending on the size of the block. Typically three different size blocks 24 may be used, the plan dimensions of the blocks (FIG. 3) typically being 2 inches by 19 inches, 2 inches by 9 inches, and 3 inches by 3 inches to accommodate the processing of different size components. The bed unit also includes a protective blanket or mask 30 made of a compliant, high temperature resistant, low heat conductivity, preferably foamed material such as foamed, silicone rubber where different size blankets preferably corresponding to the respective different sizes of the blocks 24 may be used. A hole 32 extends through blanket 30 and may either be pre-cut to conform to the size of various standardized electronic components or may be cut by the operator to conform to a specialized configuration. Thus, if the holes are pre-cut, a plurality of blankets may be provided the user, each blanket conforming to a different standardized component. When employed with the pre-cut hole, it is preferable that thin metal foil or plate 34 be attached or adhered to the bottom of blanket 30, the foil having folded-over flexible ends 36 adapted for engagement with ridges 38 in block 24. Hence, the blankets 30 may be readily interchanged for different soldering or desoldering requirements. With the added flexibility of being able to cut holes of any required configuration in the blanket, the compliant or flexible blanket of the present invention allows the user to meet all desoldering requirements. The thickness of plate 34 would typically be such that it may be readily cut when the user requires a specially configured hole in mask 30.

Bed unit 22 includes a tray 40 into which overflow solder may be contained. Furthermore, one or more skimmers 41 may be attached to the tray a predetermined distance above the bottom of the tray to remove dross and the like from the overflow solder to thus permit the user to remove such dross when necessary. Alternatively, this dross may readily be manually skimmed away since it is lighter than the solder and floats on top of it. A passageway 42, 44 extending from the bottom of tray 40 to the side of cylinder 15 permits the recyling of overflow solder.

The apparatus also includes a base assembly 212 which includes a base plate 21 having two posts 18 and 20 vertically mounted at the rear thereof, the assembly being supported by four leveling screws 60. Also mounted on the base plate is a control panel generally indicated at 46 and a cover 48. Mounted on the upper surface of cover 48 is a soft support 50 made of a compliant material such as silicone rubber. The support 50 together with the mask 30 supports the PCB 52. For ease of illustration only one component is shown in FIG. 2—that is, component 54 mounted on PCB 52. Leads 56 of component 54 extend through holes 58 in board 52. It is the basic purpose of this invention to either attach or remove the leads 56 from board 52 to thus facilitate the replacement of component 54.

The apparatus also includes a piston moving device 62. This device includes a lever 64 which rotates around an axle 66, the axle being supported by a bracket 68 which in turn is mounted on block 12 by suitable means (not shown). The lever is normally biased in the counterclockwise direction by a spring 70 attached to the rear thereof, the other end of the spring being attached to a bracket 72 mounted on base plate 21. The lever includes two arms 64a and 64b, as seen in FIG. 1, the arms being connected together at their forward ends by a handle 74. An opening 77 is provided in the forward face of cover 48, the upper edge 76 of the opening functioning as an upper stop for lever 64.

A link 78 is rotatably mounted on an axle 80 fixedly connected between arms 64a and 64b. A threaded hole 82 is provided in the bottom of link 78. A solder level adjusting member generally indicated at 84 includes a wheel 86 having a screw 88 extending therethrough, the wheel extending through opening 77 in the cover. The screw has a right-hand thread in the upper portion 90 thereof and a left-hand thread in the lower portion 92. The right-hand threaded portion 90 is threaded into the threaded hole in the bottom of link 78. The left-hand threaded portion of screw 88 is threaded into a link 94, this link being provided with a notch 96 in the lower portion thereof. Moreover, the link 94 has an axle 98 extending through the bottom thereof, the axle (FIG. 1) extending through a pair of slots 100 and 102 in the vertical arms 104 and 106 of a U-shaped bracket 108 mounted on base plate 21. Axle 98 slides in slots 100 and 102 to permit vertical movement of link 94 with respect to the base plate.

A rubber pad 110 is disposed at the bottom and center of U-shaped bracket 108, the pad acting to soften the impact of link 94 at the bottom of its downward stroke. The piston moving device 62 is shown in its "zero setting" position—that is, prior to the raising of molten solder in passageway 19 from its lowest level to its working level as will be described in more detail below. A quick release lever 112 is normally clockwise biased to the position shown in FIG. 2 by a spring (not shown) attached to an anxle 114 where axle 114 is connected between arms 104 and 106 of the U-shaped bracket. The quick release mechanism 112 comprises a lever with a first arm 116, which extends through a slot 117 (FIG. 1) in the cover for control panel 46, and a second arm 118, the second arm including latch portion 120. In operation, arm 116 is upwardly rotated against the bias of the spring to release link 94 to allow it to rise under the influence of spring 70.

The piston moving device 62 also includes a link 122 extending downwardly from an axle 124 connected between arms 64a and 64b. The lower end of the link is rotatably mounted on an axle 126 extending across a cavity 127 formed in the upper portion of piston 14. Thus, the piston is raised or lowered depending upon the upward or downward movement of lever 64.

The apparatus of the present invention also includes a board holder unit generally indicated at 128. This unit includes as shown in FIG. 2, a position point pin 130 which is threaded into a hole in an arm 132, the arm in turn being rotatably mounted on a shaft 134. As shown in FIG. 2, an arrow points to the center of component 54 to be removed. The purpose of position point pin 130 is to locate component 54 over hole 28. Since the position of hole 28 remains fixed, the position of pin 130 with respect to arm 132 is also fixed. Hence, whenever the arm is rotated about shaft 134, pin 130 will always align with the center of hole 28. Thus, a defective component, for example, of a PCB may be accurately aligned with respect to hole 28 by simply positioning the PCB 52 on support 50 and blanket 30 until the center of the component aligns with the axis of lowered pin 130.

The board holder also includes two board holder arms 136 and 138 which are connected to shaft 134. As can be seen FIG. 2, slots 140 are provided in the ends of arms 136, 138. Slots 140 engage narrowed portions 141 (FIG. 1) on shaft 134 such that the shaft rotates whenever arms 136, 138 are rotated. As can be seen in FIG. 2, pins 143 respectively extend through arms 136, 138 and the narrowed portions 141 of the shaft, the pins being threaded at the lower ends thereof and held in place by nuts 145. Rotation of the arms 136, 138 is thus possible about pins 143 in a plane parallel to that f board 52. Further, slots 142 (FIG. 2) are respectively provided in arms 136, 138, each of the slots having extending therethrough holding pins 144 and 146 so that the pins can be moved along the slots. Frictional holding means 148 and 150 hold pins 144 and 148 in place along the slots. Thus, due to the possible movement of arms 136 and 138 in a plane parallel to PCB 52 and movement of pins 144 and 146 axially with respect to the arms, it is always possible to position the holding pins 144 and 146 over areas of the PCB where no components are mounted. The pins 144 and 146 are preferably provided at their lower ends with coverings 152 and 154 made of a soft material such as rubber. Accordingly, when pins 144 and 146 are used to hold board 52 in place during a component replacement precedure, they will not harm the board.

The board holder unit also includes a cam unit generally indicated at 156, the purpose of the cam unit being to apply pressure to holding pins 144 and 146 so that the board is held in place as described above. The cam unit 156 includes an arm 158 secured to one end of shaft 134 at a point outside post 20 as can be seen in FIG. 1. Cam unit 156 also includes an arm 160, which is rotatably mounted on an axle 162 secured to post 20 such that arms 158 and 160 are disposed in the same vertical plane. Attached to arm 160 is a handle 164 via bolts 166. Camming action occurs between arms 158 and 160 via a screw 168 threaded into the end of arm 160 whereby the camming action may be adjusted depending upon the extent the screw is threaded into or out of arm 160. A stop 170 on arm 158 limits the movement of screw 168 along the surface 172 of arm 158. As will be described in more detail below, the board holder unit 128, as shown in FIG. 2, is in the position it assumes when holding a PCB board in place during a component removing or installing procedure.

A bar 174 (FIG. 2) extends between posts 18 and 20. The purpose of this bar is to provide a resting position for the position point pin arm 132 when it is in its raised position, this being indicated in FIG. 2. Moreover, arm 132 includes a leg 176 which engages bar 174 when arm 132 is lowered to limit the movement of arm 132 toward the board 52 and thus prevent excessive impact of the arm or position point pin 130 with respect to board 52. Position point pin 130 is threaded with respect to arm 132 and thus normally it is so threaded that the pin is disposed sufficiently above the components of board 52 to prevent impact therewith when arm 136 is lowered. The pin 130 may then be screwed to a point precisely in the middle component 54 to effect location of the component with respect to hole 32 as described above.

As can be seen in FIGS. 1 and 2, a plate 178 is provided at the upper rear of the apparatus while a plate 179 extends across the rear thereof (FIG. 2), these plates extending between posts 18 and 20. Slot 182 (FIG. 1) is provided in the plates to permit rotation of arm 132 therethrough whereby it may rest in its raised position as shown. Moreover, slots 180 and 184 are respectively provided for arms 136 and 138 whereby these arms may also rotate through their respective slots either to or from their respective raised positions. As will be discussed below, the arms 136 and 138 will rest against bar 174 in their raised position and may be held there due to the action of screw 168 against surface 186 of arm 158.

The desoldering apparatus also includes a solder level sensor generally indicated at 188. The particular operation of this sensor will be described in more detail hereinafter with respect to FIGS. 3 and 4. Generally, the purpose of this sensor is to determine when the molten solder in hole 32 of blanket 30 has made contact with substantially all of the targeted area beneath PCB board 52.

The apparatus of the present invention also includes a control panel 46 and indicator lights indicated at 47 which are used during a component replacement procedure. Thus, as can be seen in FIG. 1, switch 190 turns on heater 16 of block 12 and heaters 16a of block 24. Temperature control knob 192 of the control panel controls the temperature of the cartridges 16 and 16a while dial 194 provides a reading of the block temperature. Disposed on plate 178 and particularly on the portion thereof attached to leg 18 are indicators 196 through 200. Indicator 196 indicates that the heater is on. Indicator 198 indicates that the solder level sensor 188 has sensed the molten solder in hole 32 has made substantial contact with the undersurface of PCB 52 disposed over the hole. Indicator 200 indicates a ready process—that is, it comes on typically about ten to twelve seconds after the solder level light 198 comes on to indicate the component 54 may be removed or that it has been installed. Appropriate timing mechanism (not shown) effect the timing to energize ready light 200.

In operation, the installation or removal of a component 54 from board 52 is as follows. First, steps are taken to appropriately position component 54 of board 52 with respect to hole 28 of block 24. Accordingly, arms 132, 136 and 138 are all raised to their upper positions so that they contact bar 174. Arm 132 is already shown in its raised position in FIGS. 1 and 2. Arms 136 and 138 may be raised from their lowered positions shown in FIGS. 1 and 2 in the following manner. First, arm 164 of cam unit 156 is rotated in the counterclockwise direction in FIG. 2 until arm 160 achieves an approximately vertical position substantially aligned with post 20, screw 170 being disposed at the top of arm 160 when the arm is in this position. As can be appreciated, arm 160 will be rotated away from arm 158 during the latter rotation of arm 160. Arms 136 and 138 can now be rotated upwardly and back to their raised position. In particular, as they are being raised, arm 158 will also be rotated in a counterclockwise direction to a position behind post 20, generally, indicated at 158'. In particular, arm 158 can be rotated beneath the now lower edge 160a of arm 160 since the current position of arm 160 (as described above) will not interfere with the counterclockwise rotation of arm 158. The arms 136 and 138 may now be locked in their raised position by simply rotating handle 164 counterclockwise until it assumes a substantially vertical position aligned with the post 20 at which time the screw 168 of arm 160 will engage stop 171' to lock the arms 136 and 138 in their raised position. With the arms 132, 136 and 138 in their raised positions, the board 52 is now positioned on cover 50 and blanket 30. To position the component 54 over hole 28 in block 24, arm 132 is rotated to its lowered position, as discussed above, whereby pin 130 will point to the center hole 28. The component 54 may then be positioned directly under pin 144. The pin is then turned in its threaded hole in arm 132 until it is lowered on to component 54. If the pin does not contact the approximate center of the component, the pin may be raised slightly and then the component shifted slightly to finally effect rather exact alignment of the pin with the center of the component and thus alignment of the component with the hole in block 24. In some cases only approximate alignment is needed. In any event, pin 130 facilitates either precise or coarse alignment as needed.

Next, steps are taken to hold board 52 in the position established during the component alignment step. In particular, this involves placing holding pins 144 and 146 on appropriate portions of the board to hold it in place. If arms 136 and 138 are initially locked in their raised position, the steps described above for raising these arms from their lowered position to the raised, locked upper position are simply reversed. Thus, initially arm 164 is rotated in a clockwise direction until arm 160 assumes an approximately vertical position substantially aligned with post 20. Thus, clearance is provided for clockwise rotating arm 158 from its 158' position in FIG. 2 to its solid line position. Since arm 158 and arms 136 and 138 are fixedly connected to the same shaft 134, the arms 136 and 138 will also rotate in a clockwise direction to the position shown in FIGS. 1 and 2. As described above, arm 136 may be rotated slightly in a plane substantially parallel to board 52 while pins 144 and 146 may be shifted along the length of arms 136 and 138 in slots 142 to thus permit positioning of pins 144 and 146 in areas that are free of components or the like. Thus, pins 144 and 146 may be directly positioned on the board regardless of which chip 54 of the board is to be removed or installed.

In their initial position, pins 144 and 146 will rest gently on the board and thus not effectively hold the board in place. In order to apply a holding force to these pins, cam unit 156 is employed. In particular, as will be recalled, lever 146 had last clockwise rotated arm 160 to an approximate vertical position substantially aligned with post 120 to permit passage of arm 158 beneath the edge 160a of arm 160. The clockwise rotation of arm 164 may now be continued whereby screw 168 will eventually slide along arm 158 until it reaches stop 170. In the process, screw 168 will press arm 158 slightly clockwise to effect a slight downward force at pins 144 and 146 and thus effect an appropriate holding force by the pins on the board.

Once the board is positioned and held in place, it should be pre-heated to a temperature less than solder melting temperature to avoid thermal stress thereof. That is, if molten solder is applied to the board at a temperature substantially greater than the solder melt temperature (which is typically the case), the likelihood of the board being subjected to thermal stress is quite strong especially if the board is at room temperature or the like. Thus, in accordance with a feature of the invention, the board is pre-heated to avoid such thermal stress and possible attendant cracking or other damage thereof. Initially, the solder in block 10 is at the levels indicated at A in FIG. 2, the level in passageway 19 being the same as that in cylinder 15 since the molten solder is initially under ambient area pressure. The heaters 16 and 16a heat the solder to a temperature of typically about 100° greater than solder melting temperature—that is, about 467° F. Due to the low thermal conductivity of blanket 30, a temperature difference of at least about 150° F. occurs across this member. Thus, board 52 is typically heated to a pre-heat temperature of about 200° to 250° F. with the solder at levels A.

Once the pre-heating of the board has been effected, the next step is to raise the level of the molten solder in passageway 19 to the bottom of board 52 until it contacts the lower surface of the board exposed to hole 32 in blanket 30. The foregoing is explained in more detail with respect to FIGS. 3 and 4. In general, the foregoing is effected by piston moving device 62. This device is shown in its "zero position" wherein lever 64 engages stop 76 in cover 48 while link 94 engages pad 110. Thus, in this position, links 78 and 94 are spaced apart from one another the maximum possible distance. In order to draw links 78 and 94 toward one another, wheel 86 is rotated whereby screw 90 with its right-hand thread turns into link 78 to pull the link down and thus force piston 14 downwardly into cylinder 15. This, of course, raises the level of the molten solder in passageway 19. At the time wheel 86 is being rotated, screw 92 with its left-hand thread is turning into link 94. However, link 94 does not move since it is held in place by quick release latch 112. Hence, with continued rotation of wheel 86, the level of the solder in passageway 19 and hole 28 and 32 will rise until it engages the lower surface of board 52 exposed to hole 32. At this time solder level sensor 188 will detect the foregoing condition to light the solder level indicator 198. As soon as this indicator comes on, the operator stops rotation of the wheel 86 since the proper level of the solder in the hole 32 has now been reached. Moreover, as can be appreciated from the foregoing description, lever arm 64 has been moved downwardly from stop 76 a distance corresponding to the rise of the solder from level A in passageway 19 to the level where the solder level indicator was actuated. In this position, spring 70 biases lever arm 64 back to its stop point 76 but is prevented from effecting the foregoing due to the latch of link 94 by quick release latch 112. As explained above, the ready light 200 will come on typically approximately 10 to 12 seconds after the solder level light 198 comes on to thus indicate to the operator chip 54 has either been soldered in place or can be removed from the board for replacement.

Once the component 54 has been processed, the repaired board 52 may be removed from the unit after arms 132, 136 and 138 have been raised to their rest positions in the manner described hereinbefore. With the board removed, the operator can view the upper surface of the molten solder to determine if dross or the like is present therein. After an extended number of uses, there is a possibility such dross will be present and should be removed, this can be effected by removing the blanket 30 whereby the dross will spill over the upper surface 26 of block 24 into tray 40. There it may either be removed by a scraper 41 or the like or be allowed to pass through passageway 42, 44 to cylinder 15. In any event, it can be removed from the area where the molten solder contacts the undersurface of board 52. Assuming some of the dross is passed to cylinder 15. It may not be able to enter the cylinder at this time since piston 14 may be lowered thereby blocking off passageway 42, 44. However, the next time the piston is raised, the dross can settle into cylinder 15. Removable plugs 200 and 202 at opposite ends passageway 17 may be removed to facilitate the removal of dross which may collect at the bottom passageway 19 and cylinder 15.

Rather than removing blanket 30 to remove any dross which may be present at the upper surface of the molten solder, wheel 86 may be further rotated to further depress piston 14 into cylinder 15, thus, intentionally causing the molten solder to flow over the blanket 30 (which is not wetted by the solder) into tray 40 where it may be again collected in the manner described above.

Furthermore, in certain modes of operation the board 52 may be slightly spaced from blanket 30 whereby the molten solder would be intentionally flowed through hole 32, the space between board 52 and blanket 30 and then into tray 40 where it would be returned to cylinder 15 as described above. Another embodiment of such a closed-loop arrangement is described in FIGS. 5 and 6 hereafter.

Assuming there is no or an insignificant amount of dross in the upper surface of the molten solder as viewed by the operator through hole 28 in block 24, and assuming another board is to be repaired, the solder should be restored to level A in passage 19 to permit pre-heating of the next board. This is effected by raising quick release latch 112 to remove the latch from link 94. At the same time the molten solder in passageway 19 is restored to level A, that in cylinder 15 is also restored to level A. Moreover, any solder in passageway 42, 44 is returned to the cylinder since the lower edge of piston 14 rises above the opening of the passageway extending into the cylinder.

Once the board has been pre-heated in the manner described above, it is not necessary to rotate wheel 86 again to raise the solder in passageway 19 to the level which triggers solder level sensor 188. Rather, this occurs automatically since the spacing between links 92 and 94 has been decreased from that shown in FIG. 2 by an amount which corresponds to the distance the solder rises from level A to the solder level sensor trigger level. Hence, the operator need only to press handle 74 until link 94 engages rubber pad 110 at which time it will be again held in place by latch 120. Hence, the piston moving device 62 of the present invention includes means for automatically reestablishing the desired level of the solder in passageway 19 after the initial use thereof. Any further fine adjustments of the solder level necessitated, for example, by the removal of dross, can be effected by further fine adjustment by rotating wheel 86. As will be described below a valve may be provided in passageway 19 such that the rate of rise of the solder in the passageway is gradual.

Figure 3:
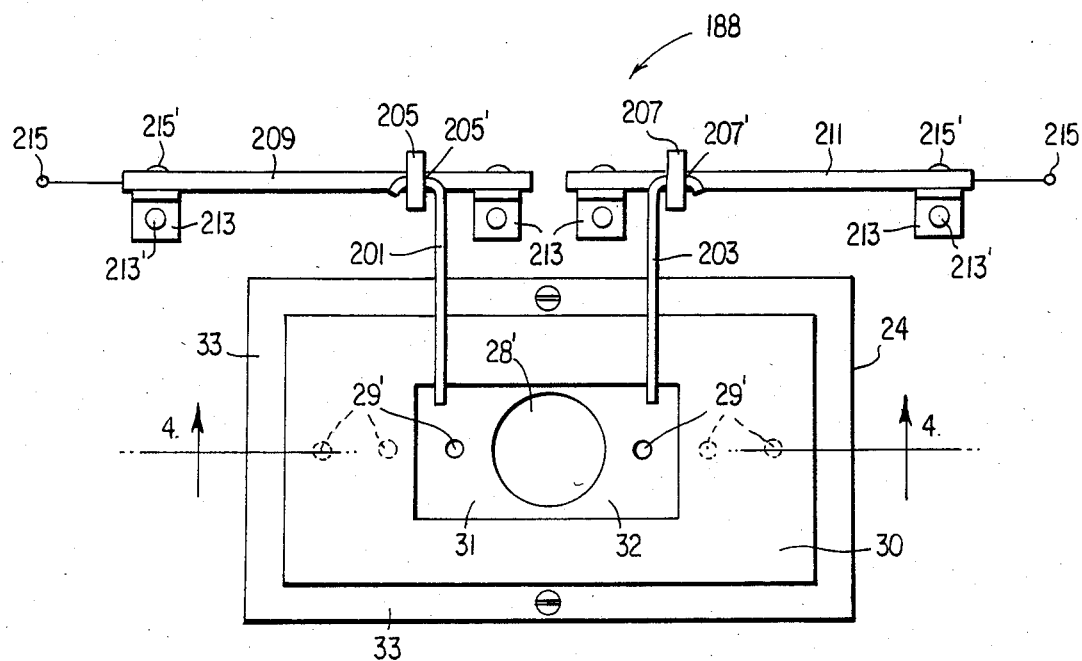
FIG. 3 is a plan view of an illustrative bed unit for use in the present invention.
Figure 4:
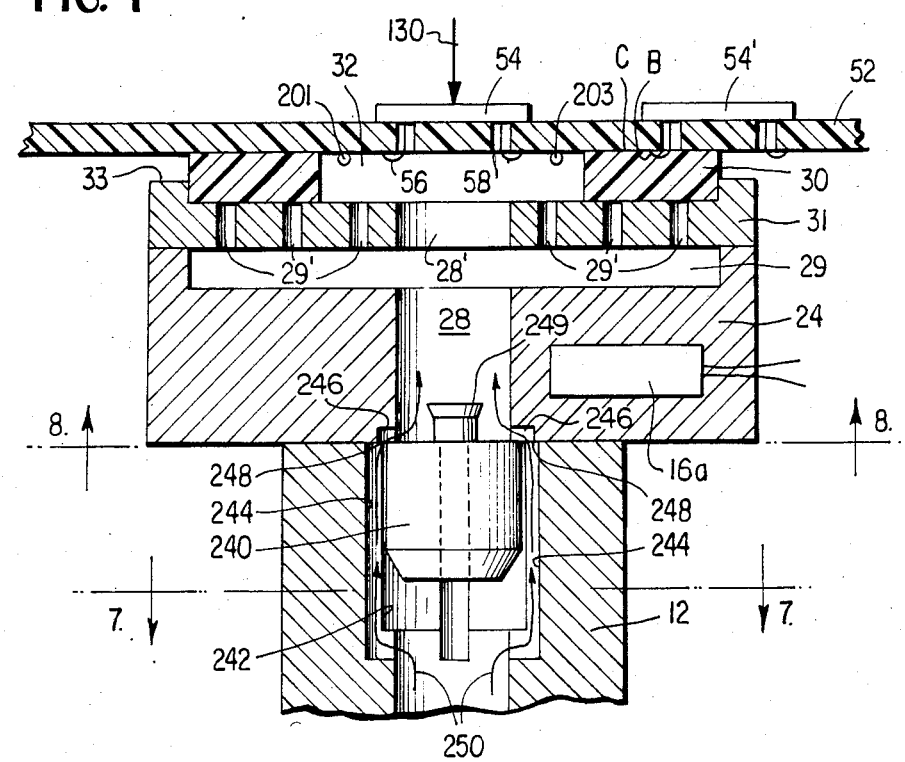
FIG. 4 is a cross-sectional view of the bed unit of FIG. 3 taken along the lines 4—4 of FIGS. 2 and 3.

As can be seen in FIG. 4, heater block 24 may have a chamber 29 formed in the upper portion thereof. Mounted to block 24 is a plate 31 which covers the chamber 29. A hole 28' extends through the center of the plate in alignment with hole 28 in block 24, holes 28 and 28' typically having the same diameter. Also provided in plate 31 are a plurality of holes 29' where the holes may be disposed along the length of plate 31 as shown in FIG. 3. Moreover, plate 31 may have a raised peripheral portion 33 for receiving blanket 30. That is, the internal perimeter of raised portion 33 is slightly greater than the perimeter of blanket 30 and conforms in shape thereto, the shape typically being rectangular.

As can be seen in FIG. 3, hole 32 in blank 30 may expose one or more pairs of holes 29' on the opposite sides of hole 28'. Accordingly, as solder rises in hole 28 of block 24 and fills chamber 29, it will also rise in hole 28' and the holes 29'. However, in the configuration shown in FIGS. 3 and 4, only the solder which rises through hole 28' and the first pair of holes 29' on opposite sides of hole 28' will enter hole 32 in blanket 30. From the foregoing, it can be seen the holes 29' provide additional solder to hole 32 depending on the size of the latter hole.

Assuming a component is to be removed, solder may tend to remain in holes 58 in board 52. Accordingly, a hot air jet source (not shown) may be directed on the melted solder in the holes to remove the solder therefrom.

Referring to FIGS. 2 through 4, the level sensor 188 is shown in further detail, the purpose of this sensor, as stated above, being to sense when the molten solder has risen within hole 32 in blanket 30 to a level where it sufficiently contacts the underside of PCB 52 such that leads 56 may be soldered or desoldered from the board.

Accordingly, sensor 188 includes a pair of electrical wires 201 and 203 which are pivotally mounted in U-shaped slides 205 and 207. In particular, the wires 201 and 203 are shown in FIGS. 2 through 4 in their lowered position where they rest on blanket 30 and extend over hole 32. The wires may be raised and pivoted away from the blanket in the counterclockwise direction (FIG. 2) to a raised position where they extend substantially vertically.

Slides 205 and 207 are respectively slideably mounted on bands 209 and 211. These bands are, in turn, mounted on brackets 213 by bolts 215', while the brackets 213, are, in turn, mounted on bracket 68 (FIG. 2) via bolts 213'. Bands 209 and 211 are respectively connected to electrical terminals 215 (FIG. 3), the terminals being respectively connected to the positive and negative terminals of an electrical power source (not shown). Bands 209 and 211 and slides 205 and 207 are electrically conductive and thus, a continuous electrical path is established between terminal 215 of band 209 to terminal 215 of band 211 whenever the solder in hole 32 rises to a sufficient height to establish an electrical connection between wires 201 and 203 to thus effect the solder level sensing function of sensor 188.

Since slides 205 and 207 can be moved to different positions along the lengths of bands 209 and 211, wires 201 and 203 can be positioned at the approximately ends of hole 32, as shown in FIG. 3, regardless of where the hole is positioned along the imaginary line defined by hole 28' and holes 29'. By positioning the wires at the approximate ends of hole 32, level sensor 188 insures that the solder will have contacted a sufficient portion of the surface of board 52 exposed to hole 32. That is, the upper surface of the solder in hole 32 tends to assume the shape of an upwardly convex meniscus, this phenomenon being associated with liquids present in tubes or the like. Thus the center of the exposed surface of board 52 would tend to be first contacted by the rising solder in hole 32. As the solder continues to rise, it will spread towards the ends of hole 32 where wires 201 and 203 are located. Of course, when both wires engage the solder, solder level sensor 188 is actuated to turn light 198 on, the light typically being in electrical series with the above mentioned electrical power source connected to terminals 215.

In operation, whenever it is desired to replace blanket 30 or replace block 24, the wires 201 and 203 may be rotated about their respective pivot points 205' and 207'. Once a new blanket has been secured in place, wires 201 and 203 may be rotated downwardly to their resting position shown in FIGS. 2 through 4. Due to the compliance of blanket 30, the wires will depress into the blanket when a board 52 is placed thereon to effect repair thereof and thus the repair operation will not be affected.

Other arrangements may also be employed for sensing the level of the solder within hole 32. Thus, for example, if the hole 32 in pad 30 is pre-cut, the leads 201 and 203 may be incorporated in blanket 30 to form an integral part thereof. Since it is contemplated that blankets 30 with pre-cut holes therein may constitute a disposable item for use with the apparatus of the present invention, these items may include wires 201 and 203 as an integral part thereof where the wires would, typically be imbedded within the upper portion of pad 30. Preferably, wires 201 and 203, whether integrally incorporated into pad 30 or not, would preferably include a heat resistant insulating cover extending over a substantial length thereof such that the exposed portions thereof would be those portions in communication with hole 32. If integrally incorporated into pad 30, the wires would extend to slides similar to U-shaped slides 205, 207 to make electrical contact therewith where the slides would again facilitate the use of different size pads 30. Moreover, although shown communicating with the same side of hole 32, leads 201, 203 may communicate with opposite, diagonal corners of the hole to further insure that the solder sufficiently contacts the underside of board 52 to effect component repair.

Referring to FIG. 4, there is shown a valve arrangement including an enlarged portion 242 of hole 19 in block 12 and a plunger 240 disposed within the enlarged portion. This valve arrangement is optional and has as its purpose the control of the rate of rise of the solder from level A (FIG. 2) toward hole 32 such that the rate is relatively slow and steady while permitting the solder to return at a more rapid rate to level A. Accordingly, any known valve arrangement for effecting the foregoing may be employed. The arrangement of FIG. 4 is particularly advantageous in terms of manufacturing ease and cost. In FIG. 4, the valve is shown in its raised position to thereby regulate the rise of the molten solder in passageway 19 to hole 32 such that the rise is slow and steady. In general, the valve arrangement includes a plunger 240, the diameter of which is slightly smaller than that of a enlarged portion 242 of hole 19 aligned with holes 19 and 28. Disposed about the periphery of enlarged portion 242 are a plurality (typically four) by-pass channels 244, the channels 244 extending around the bottom of enlarged portion 242 to thereby provide a flow path of the molten solder around plunger 240 regardless of the position of the plunger.

Figure 8:
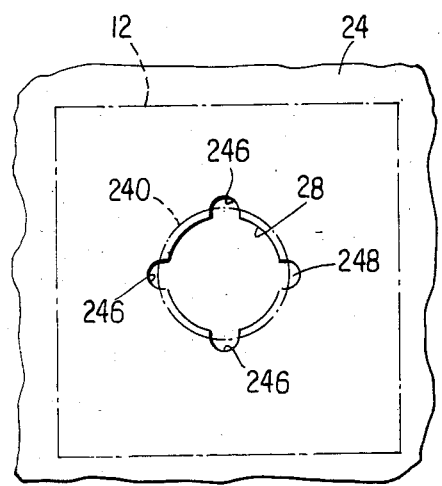

Also disposed about the lower portion of hole 28 in block 24 are a plurality of by-pass channels 246 which also provide a flow-path for the molten solder. As can be seen in FIG. 4, the depth of channels 246 is substantially less than the depth of channels 244. Hence, as can be seen FIGS. 4 and 8, the solder will rise as indicated by the arrows 250 toward hole 32 in the blanket in the following manner, it being noted plunger 240 (the density of which is lighter than that of the solder (typically about two-thirds the density of the solder)) is in its raised position within enlarged chamber 242 such that the upper surface thereof partially encloses the lower ends of the grooves 246 formed in the lower portion of hole 28. Accordingly, a restriction is established for the solder as it passes this point. In particular, as can be seen in FIG. 8, the blockage of portions of the grooves 246 by plunger 240 (shown in dotted outline) leaves only the uncovered portions 248 of the grooves to pass solder from grooves 244 to the portions 248 of grooves 246, the grooves 246 and 244 being aligned. Once the solder passes through uncovered portions 248 of grooves 246, it encounters a baffle member 249 which may constitute a screw or the like threaded into the upper portion of plunger 240. As can be seen the baffle 249 randomly reflects the incoming solder therefrom to further provide a reduced, steady flow rate toward hole 32.

Figure 9:
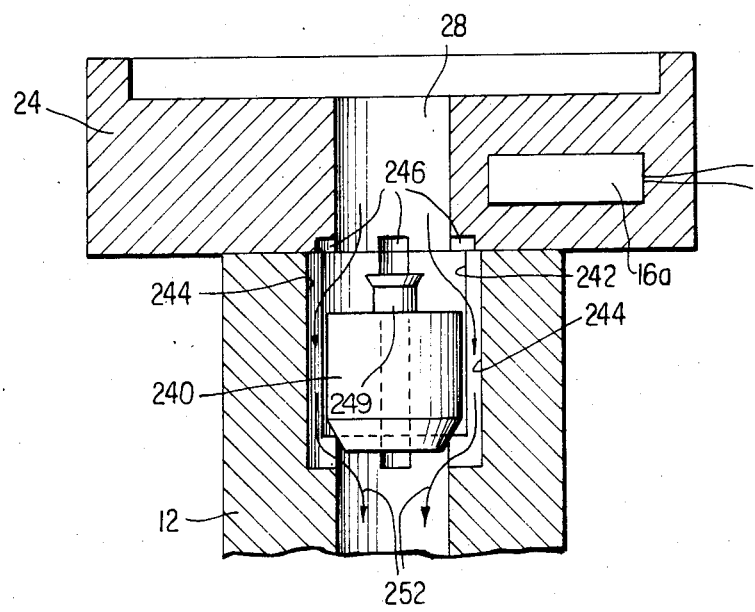
FIG. 9 is a cross-sectional view corresponding to FIG. 4 further illustrating the valve of FIGS. 7 and 8.

The plunger 240 is shown in its lowered position in FIG. 9 to facilitate the rapid return of the solder to levels A (FIG. 2). In particular, in this position the plunger will drop immediately as the level in hole 28 drops and almost immediately assume the position shown in FIG. 9. There it can be seen the upper surface of plunger 240 no longer restricts the grooves 246 and thus the solder flow as indicated by arrows 252 moves readily around the upper portion of the plunger through the grooves 244 and then into passageway 19 to be returned to level A.

From the foregoing, it can be seen, the compliant blanket 30 constitutes an important feature of the present invention. Thus, referring to FIG. 4, solder is brought to the leads 56 of component 54 to effect the removal or installation thereof without overheating adjacent components such as device 54' due to the low heat conductivity of the pad. Moreover, due to the resiliency of the pad, the leads of adjacent component 54' will depress into pad 30 as indicated at B. Further, the resilient surface of pad 30 will tend to effect a seal between hole 32 and adjacent component 54' as indicated at C to prevent solder from reaching the leads of this component. Hence, the pad facilitates effective isolation between the component 54 being processed and adjacent component 54'. Moreover, the low heat conductivity of blanket 30 facilitates pre-heating of board 52 to prevent thermal shock thereof. Further, the resiliency of the pad prevents marring of the undersurface of board 52. Moreover, pad 30 may be used as a disposable item where the pads can be readily interchanged because the pad simply lies on plate 31 although further means may be provided, if desired, for more securely attaching the pad to the plate. Furthermore, the operator may form an opening of any desired configuration within the pad such that any special configuration of a component or components can be processed at one time.

Figure 5:
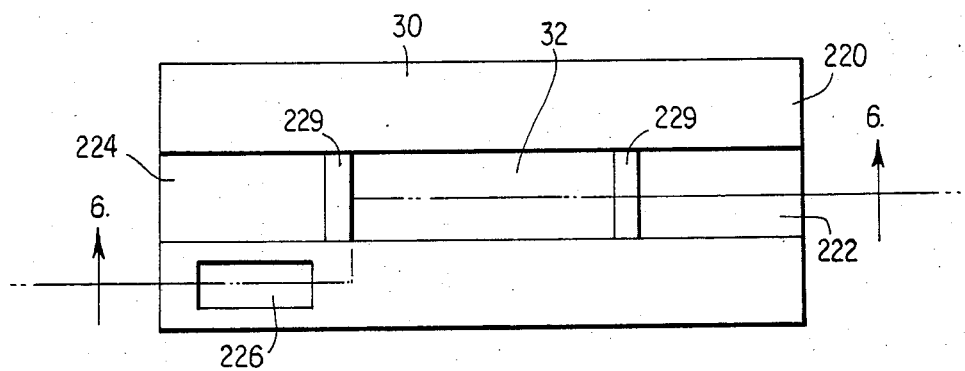
FIG. 5 is a plan view of a modified, illustrative blanket for use in the present invention.
Figure 6:
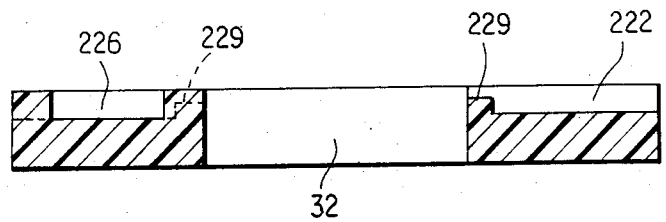
FIG. 6 is a cross-sectional view taken on the line 6—6 of FIG. 5.
Figure 7:
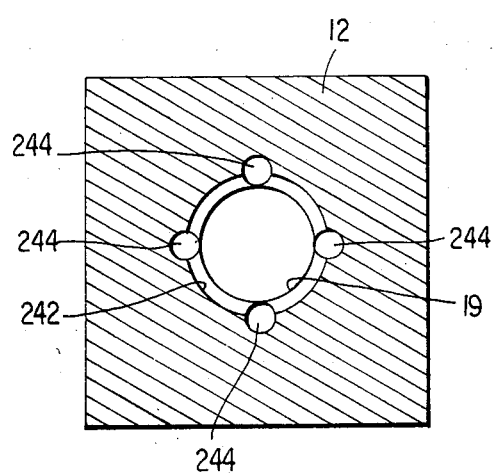
FIGS. 7 and 8 are cross-sectional views taken on the lines 7—7 and 8—8 of FIG. 4 which illustrate a valve in accordance with the invention.

Reference should now be made to FIGS. 5 and 6 which show further features which may be incorporated into pad 30. Hence, if the pad is to be used in a closed-loop system, where the solder is intentionally returned from hole 32 back to cylinder 15 via passageways 42 and 44, one or more channels 222 and 224 may be formed on the pad adjacent hole 32 such that the solder is allowed to flow through the channels from hole 32, as can be appreciated from FIG. 6. Moreover, narrow ridges 229 may be employed to insure the solder rises to a sufficient height in hole 32 while at the same time the flow through the channels is removed from the board underside. Furthermore, cavities 226 may be incorporated in pad 30 to receive any components which may be disposed on the underside of board 52.

Thus, it can be seen from the foregoing, the compliant pad 30 of the present invention, together with the other features thereof, discussed above, provide a cost effective capability for installing or removing through-hole mounted components of a PCB.

In general, the apparatus enables the hot, temperature controlled, medium such as solder to be directed at a specific area on the pre-heated PCB, while protecting other areas on the board from damaging temperature rise. All the leads in the selected area, which can, for example, range from one lead of a single terminal to 540 leads of an 18 inch triple bank edge-connector, are desoldered simultaneously.

As indicated above, the system of the present invention may also be employed in a closed-loop system. In this regard, it should be noted the offset position of piston 14 and cylinder 15 with respect to the axis of the holes defined by hole 28 in block 24 and hole 19 in block 12 is particularly advantageous whether the system is used in an open or closed mode of operation. That is, in prior art systems utilized hereinbefore, a piston and cylinder arragement was disposed directly beneath the solder pot supporting the PCB or the like where the solder would be raised upon the upward stroke of the piston and lowered on the downward stroke thereof. This necessitated particularly elaborate and expensive sealing arrangements around the periphery of the piston to seal the solder within the cylinder. By providing an offset arrangement of the piston with respect to the hole 28 in block 24, no such elaborate sealing arrangements are necessary since the solder does not remain in direct contact with the solder-contacting surface of the piston in its rest position. Thus, as can be seen in FIG. 2, the lower end of the piston in fact rises above the level A of the solder in the cylinder when the piston is in this position. Accordingly, sealing requirements are substantially lessened in the present invention.

Moreover, due to the offset arrangement of the piston and cylinder, in some applications of the invention, the board 52 may be spaced from mask 30 where the mask may be made of either a compliant or non-compliant material. Furthermore, in certain applications, mask 30 may be dispensed with such that in a closed mode of operation, either a continuous or intermentent flow of the solder may be established where the solder would rise above opening 28 in a fountain-like manner to engage the selected portion of the board to be soldered or desoldered. The overflow would then be returned to tray 40 by appropriate means, such as those discussed above, and then returned to cylinder 15 via passageways 42, 44 to complete the closed loop system. Again, the advantages of the offset piston, cylinder arrangement are thus realized in systems which may or may not use a mask. Moreover, when using a compliant mask, the advantages thereof may be obtained even when piston is disposed directly below the solder pot.

It is to be understood that the above detailed description of the various embodiments of the invention is provided by way of example only. Other details of design and construction may also be modified without departing from the true spirit and scope of the invention as set forth in the appended claims.

What is claimed is:

1. An apparatus for removing or installing at least one through-hole mounted component from a printed circuit board or the like, said apparatus comprising;
   a mask having at least one hole extending therethrough, said hole being aligned with said component;
   means for directing a heated, liquid medium into said hole in the mask to contact leads of said component and thus facilitate said installation or removal thereof from the board;
   a support member having a surface for supporting said mask, said support member having a first passageway extending therein in communication with said means for directing the heated liquid medium, a chamber disposed in said support member in communication with said first passageway, and a plurality of holes extending from said chamber to said surface of said support member, the hole in the mask being in communication with at least one of said plurality of holes whereby a continuous pathway is established through said support member to the hole in the mask from said means for directing the heated medium, said path including said first passageway, said chamber, and at least one of said plurality of holes.

2. An apparatus as in claim 1 where one of said plurality of holes is centrally disposed with respect to the remaining holes and where said one hole is in substantial alignment with said first passageway.

3. An apparatus for removing or installing at least one through-hole mounted component from a printed circuit board or the like, said apparatus comprising:
   means for contacting and supporting the printed circuit board including a compliant mask having at least one hole extending therethrough, said hole being aligned with said component, said mask including at least one channel disposed therein extending from said hole to an edge of the mask and said apparatus including means for circulating liquid solder in a closed path, said path including at least said hole and said channel in the mask, and said mask in use having a temperature drop thereacross of about 150°–200° F., and
   means for directing liquid solder into said hole in the mask to contact leads of said component and thus facilitate said installation or removal thereof from the board.

4. An apparatus for removing or installing at least one through-hole mounted component from a printed circuit board or the like, said apparatus comprising:
   means for contacting and supporting the printed circuit board including a foamed compliant mask having at least one hole extending therethrough, said hole being aligned with said component, said mask including at least one channel disposed therein extending from said hole to an edge of the mask and said apparatus including means for circulating liquid solder in a closed path, said path including at least said hole and said channel in the mask; and,
   means for directing liquid into said hole in the mask to contact leads of said component and thus facilitate said installation or removal thereof from the board.

5. An apparatus for removing or installing at least one through-hole mounted component from a printed circuit board or the like, said apparatus comprising:
   means for contacting and supporting the printed circuit board including a compliant mask having at least one hole extending therethrough, said hole being aligned with said component, said mask including at least one channel disposed therein extending from said hole to an edge of the mask and said apparatus including means for circulating liquid solder in a closed path, said path including at least said hole and said channel in the mask;
   means for directing liquid solder into said hole in the mask to contact leads of said component and thus facilitate said installation or removal thereof from the board; and
   heating means for preheating said board to a temperature less than the melting temperature of the solder.

6. An apparatus according to claim 5 in which said heating means operates at a temperature greater than said solder melting temperature.

7. An apparatus for removing or installing at least one through-hole mounted component from a printed circuit board or the like, said apparatus comprising means for contacting and supporting the printed circuit board including a compliant mask having at least one hole extending therethrough, said hole being aligned with said component;
   said mask including at least one channel disposed therein extending from said hole to an edge of the mask and said apparatus including means for circulatng liquid solder in a closed path, said path including at least said hole and said channel in the mask; and means for directing liquid solder into said hole in the mask to contact leads of said component and thus facilitate said installation or removal thereof from the board.

8. An apparatus for removing or installing at least one through-hole mounted component from a printed circuit board or the like, said apparatus comprising:

means for contacting and supporting the printed circuit board including a compliant mask having at least one hole extending therethrough, said hole being aligned with said component, said mask including at least one channel disposed therein extending from the said hole to an edge of the mask and said apparatus including means for circulating liquid solder in a closed path, said path including at least said hole and said channel in the mask;

means for directing liquid solder into said hole in the mask to contact leads of said component and thus facilitate said installation or removal thereof from the board; and a passageway between said means for directing the liquid solder and said hole in the mask, said apparatus including plunger means disposed in said passageway for regulating the flow rate of said liquid solder to said hole.

9. An apparatus for removing or installing at least one through-hole mounted component from a printed circuit board or the like, said apparatus comprising means for contacting and supporting the printed circuit board including a compliant mask having at least one hole extending therethrough, said hole being aligned with said component;

means for directing liquid solder into said hole in the mask to contact leads of said component and thus facilitate said installation or removal thereof from the board; and a support member having a surface for supporting said mask, said support member having a first passageway extending therein in communication with said means for directing the solder, a chamber disposed in said support member in communication with said first passageway, and a plurality of holes extending from said chamber to said surface of said support member, the hole in the mask being in communication with at least one of said plurality of holes whereby a continuous pathway is established through said support member to the hole in the mask from said means for directing the liquid solder, said path including said first passageway, said chamber, and at least one of said plurality of holes.

10. A compliant mask for use with apparatus for removing or installing at least one through-hole mounted component from a printed circuit board or the like, said apparatus including means for supporting the printed circuit board and means for directing liquid solder to contact leads of said component and thus facilitate said installation or removal thereof from the board, said compliant mask comprising:

a compliant plate-like member having at least one hole extending therethrough, said hole being aligned with said component, and said member including at least one channel disposed therein extending from said hole to an edge of the mask and said apparatus including means for circulating said liquid solder in a closed path, said path including at least said hole and said channel in the member.

11. An apparatus for removing or installing at one through-hole mounted component from a printed circuit board or the like, said apparatus comprising:

a mask having at least one hole extending therethrough, said hole being lined with said component;

means for directing liquid solder into said hole in the mask to contact leads of said component;

means for sensing the level of said liquid solder in said hole to thereby sense when the solder has made sufficient contact with the board to thereby facilitate said removing or installing of the component, said level sensing means including first and second electrically conductive wires respectively disposed at opposite sides of the hole in the mask;

first means for pivotally mounting said first wire; and second means for pivotally mounting said second wire so that the wires may be rotated away from said mask to facilite placement of the mask.

12. An apparatus as in claim 11, where said wires are embedded in said mask.

13. An apparatus as in claim 11, including a first electrically conductive band disposed adjacent one side of said mask and a second electrically conductive band disposed adjacent the other side of the mask, first and second electrically conductive slides respectively, slideably mounted on said first and second bands, an electrical power source having a first terminal connected to one of said bands and a second terminal connected to the other of said bands, and indicating means connected in electrical circuit with said bands and said electrical power source whereby a continuous electrical path is established from said first terminal through one of said bands and its associated slide through one of said wires and said liquid solder to the other of said wires, it associated slide and the other of said bands to the second terminal of the electrical power supply, said continuous electrical path being established in response to said liquid solder establishing sufficient contact with said board to facilitate said removing or installing of said component.

14. An apparatus for removing or installing at least one through-hole mounted component from a printed circuit board or the like, said apparatus comprising:

a mask having at least one hole extending therethrough, said hole being aligned with said component;

means for directing liquid solder into said hole in the mask to contact leads of said component and thus facilitate said installation or removal thereof from the board;

a passageway between said means for directing the liquid solder and said hole in the mask; and plunger means disposed in an enlarged portion of said passageway for regulating the flow rate of said liquid solder to said hole, the diameter of said plunger being slightly less than that of the enlarged portion, a first plurality of channels of a predetermined size disposed in the side wall of said enlarged portion, and a further plurality of channels in respective communication with said first plurality of channels and disposed in the portion of said passageway above said enlarged portion, said plunger being displaceable between (a) a raised position at the upper end of said enlarged portion where it restricts upward flow of the liquid solder to provide a smooth, steady flow thereof due to the plunger completely covering the opening of the upper portion of the enlarged portion and partially covering said further plurality of channels so that said liquid solder flows from said first plurality of channels to the passageway above the enlarged portion only via the portions of said further plurality of channels not covered by the plunger and (b) a lowered position removed from said opening in the upper portion of the enlarged portion and said further plurality of channels so that said liquid solder rapidly flows away from the hole in the mask via said first plurality of channels to the means for directing the liquid solder, whereby the liquid solder may be more rapidly returned towards said latter means that when it is directed to the hole in the mask.

15. An apparatus as in claim 14 where the density of said plunger is less than that of said liquid solder.

16. An apparatus as in claim 14 including a baffle disposed on top of said plunger to further reduce the flow of said liquid solder as it passes from said portions of the further plurality of channels not covered by the plunger.

17. An apparatus for removing or installing at least one through-hole mounted component from a printed circuit board or the like, said apparatus comprising:

a mask having at least one hole extending therethrough, said hole being aligned with said component, means for directing liquid solder into said hole in the mask to contact leads of said component and thus facilitate said installation or removal thereof from the board; and means for returning the liquid solder to substantially the same level in the hole each time the solder is returned to the hole, including a lever connected to a piston for moving the piston in a first direction to thereby move said solder to said same level in the hole, means for biasing said lever to a first position where the solder is removed from the hole, link means attached to said piston, said link means including means for adjusting the length thereof, means for latching said link means in a latched position corresponding to said solder being at the same level in the hole, said solder being returned to the same level each time said lever is moved from its first position after said link means initially has the length thereof adjusted so that the link means is latched in said latched position, and means for releasing said latch means so that said lever means can be returned to its first position and said solder can be removed from said hole whereby said solder will be returned to said same level the next time the lever is moved in said first direction to again latch the link means in its latched position.

* * * * *